United States Patent
Yu et al.

(10) Patent No.: US 10,084,099 B2
(45) Date of Patent: *Sep. 25, 2018

(54) ALUMINUM GRID AS BACKSIDE CONDUCTOR ON EPITAXIAL SILICON THIN FILM SOLAR CELLS

(71) Applicant: SolarCity Corporation, San Mateo, CA (US)

(72) Inventors: Chentao Yu, Sunnyvale, CA (US); Zheng Xu, Pleasanton, CA (US); Jiunn Benjamin Heng, San Jose, CA (US); Jianming Fu, Palo Alto, CA (US)

(73) Assignee: Tesla, Inc., Palo Alto, CA (US)

( * ) Notice: Subject to any disclaimer, the term of this patent is extended or adjusted under 35 U.S.C. 154(b) by 337 days.

This patent is subject to a terminal disclaimer.

(21) Appl. No.: 14/691,403

(22) Filed: Apr. 20, 2015

(65) Prior Publication Data

US 2015/0270411 A1   Sep. 24, 2015

Related U.S. Application Data

(63) Continuation of application No. 12/617,382, filed on Nov. 12, 2009, now Pat. No. 9,012,766.

(51) Int. Cl.
*H01L 31/02* (2006.01)
*H01L 31/0216* (2014.01)
(Continued)

(52) U.S. Cl.
CPC .... *H01L 31/0201* (2013.01); *H01L 31/02167* (2013.01); *H01L 31/02168* (2013.01);
(Continued)

(58) Field of Classification Search
CPC ....... H01L 31/02168; H01L 31/022425; H01L 31/1804; H01L 31/068
See application file for complete search history.

(56) References Cited

U.S. PATENT DOCUMENTS

| | | |
|---|---|---|
| 819,360 A | 3/1902 | Mayer |
| 2,938,938 A | 5/1960 | Dickson |
| 3,094,439 A | 6/1963 | Mann et al. |
| 3,116,171 A | 12/1963 | Nielsen |
| 3,459,597 A | 8/1969 | Baron |

(Continued)

FOREIGN PATENT DOCUMENTS

| | | |
|---|---|---|
| CN | 1253381 | 5/2000 |
| CN | 1416179 | 10/2001 |

(Continued)

OTHER PUBLICATIONS

Hornbachner et al., "Cambered Photovoltaic Module and Method for its Manufacture" Jun. 17, 2009.
(Continued)

*Primary Examiner* — Golam Mowla
(74) *Attorney, Agent, or Firm* — Shun Yao; Park, Vaughan, Fleming & Dowler LLP (57) ABSTRACT

One embodiment of the present invention provides a solar cell. The solar cell includes a substrate, a first heavily doped crystalline-Si (c-Si) layer situated above the substrate, a lightly doped c-Si layer situated above the first heavily doped crystalline-Si layer, a second heavily doped c-Si layer situated above the lightly doped c-Si layer, a front side electrode grid situated above the second heavily doped c-Si layer, and a backside electrode grid situated on the backside of the substrate.

11 Claims, 4 Drawing Sheets

(51) Int. Cl.
  *H01L 31/0224* (2006.01)
  *H01L 31/068* (2012.01)
  *H01L 31/18* (2006.01)
(52) U.S. Cl.
  CPC .... *H01L 31/022425* (2013.01); *H01L 31/068* (2013.01); *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 3,676,179 A | 7/1972 | Bokros | |
| 3,961,997 A | 6/1976 | Chu | |
| 3,969,163 A | 7/1976 | Wakefield | |
| 4,015,280 A | 3/1977 | Matsushita et al. | |
| 4,082,568 A | 4/1978 | Lindmayer | |
| 4,124,410 A | 11/1978 | Kotval et al. | |
| 4,124,455 A | 11/1978 | Lindmayer | |
| 4,193,975 A | 3/1980 | Kotval et al. | |
| 4,200,621 A | 4/1980 | Liaw et al. | |
| 4,213,798 A | 7/1980 | Williams et al. | |
| 4,251,285 A | 2/1981 | Yoldas | |
| 4,284,490 A | 8/1981 | Weber | |
| 4,315,096 A | 2/1982 | Tyan | |
| 4,336,648 A | 6/1982 | Pschunder et al. | |
| 4,342,044 A | 7/1982 | Ovshinsky et al. | |
| 4,431,858 A | 2/1984 | Gonzalez et al. | |
| 4,514,579 A | 4/1985 | Hanak | |
| 4,540,843 A | 9/1985 | Gochermann et al. | |
| 4,567,642 A | 2/1986 | Dilts et al. | |
| 4,571,448 A | 2/1986 | Barnett | |
| 4,577,051 A | 3/1986 | Hartman | |
| 4,586,988 A | 5/1986 | Nath et al. | |
| 4,589,191 A | 5/1986 | Green et al. | |
| 4,612,409 A | 9/1986 | Hamakawa et al. | |
| 4,617,421 A | 10/1986 | Nath | |
| 4,633,033 A | 12/1986 | Nath et al. | |
| 4,652,693 A | 3/1987 | Bar-On | |
| 4,657,060 A | 4/1987 | Kaucic | |
| 4,667,060 A | 5/1987 | Spitzer | |
| 4,670,096 A | 6/1987 | Schwirtlich | |
| 4,694,115 A | 9/1987 | Lillington et al. | |
| 4,729,970 A | 3/1988 | Nath | |
| 4,753,683 A | 6/1988 | Ellion | |
| 4,771,017 A | 9/1988 | Tobin et al. | |
| 4,784,702 A | 11/1988 | Henri | |
| 4,877,460 A | 10/1989 | Flodl | |
| 4,933,061 A | 6/1990 | Kulkarni | |
| 4,968,384 A | 11/1990 | Asano | |
| 5,053,355 A | 10/1991 | von Campe | |
| 5,057,163 A * | 10/1991 | Barnett | H01L 31/02242 136/256 |
| 5,075,763 A | 12/1991 | Spitzer et al. | |
| 5,084,107 A | 1/1992 | Deguchi | |
| 5,118,361 A | 6/1992 | Fraas | |
| 5,131,933 A | 7/1992 | Flodl et al. | |
| 5,155,051 A | 10/1992 | Noguchi | |
| 5,178,685 A | 1/1993 | Borenstein | |
| 5,181,968 A | 1/1993 | Nath et al. | |
| 5,213,628 A | 5/1993 | Noguchi et al. | |
| 5,217,539 A | 6/1993 | Fraas et al. | |
| 5,279,682 A | 1/1994 | Wald et al. | |
| 5,286,306 A | 2/1994 | Menezes | |
| 5,364,518 A | 11/1994 | Hartig | |
| 5,401,331 A | 3/1995 | Ciszek | |
| 5,455,430 A | 10/1995 | Noguchi et al. | |
| 5,461,002 A | 10/1995 | Safir | |
| 5,563,092 A | 10/1996 | Ohmi | |
| 5,576,241 A | 11/1996 | Sakai | |
| 5,627,081 A | 5/1997 | Tsuo et al. | |
| 5,676,766 A | 10/1997 | Probst et al. | |
| 5,681,402 A | 10/1997 | Ichinose et al. | |
| 5,698,451 A | 12/1997 | Hanoka | |
| 5,705,828 A | 1/1998 | Noguchi et al. | |
| 5,726,065 A | 3/1998 | Szlufcik et al. | |
| 5,808,315 A | 9/1998 | Murakami | |
| 5,814,195 A | 9/1998 | Lehan et al. | |
| 5,903,382 A | 5/1999 | Tench et al. | |
| 5,935,345 A | 8/1999 | Kuznicki | |
| 6,017,581 A | 1/2000 | Hooker | |
| 6,034,322 A | 3/2000 | Pollard | |
| 6,091,019 A | 7/2000 | Sakata et al. | |
| 6,140,570 A | 10/2000 | Kariya | |
| 6,232,545 B1 | 5/2001 | Samaras | |
| 6,303,853 B1 | 10/2001 | Fraas | |
| 6,333,457 B1 | 12/2001 | Mulligan et al. | |
| 6,410,843 B1 | 6/2002 | Kishi | |
| 6,441,297 B1 | 8/2002 | Keller | |
| 6,468,828 B1 | 10/2002 | Glatfelter | |
| 6,488,824 B1 | 12/2002 | Hollars | |
| 6,538,193 B1 | 3/2003 | Fraas | |
| 6,620,645 B2 | 3/2003 | Fraas | |
| 6,552,414 B1 | 4/2003 | Horzel et al. | |
| 6,586,270 B2 | 7/2003 | Tsuzuki et al. | |
| 2,626,907 A1 | 9/2003 | Chandra | |
| 6,672,018 B2 | 1/2004 | Shingleton | |
| 6,683,360 B1 | 1/2004 | Dierickx | |
| 6,736,948 B2 | 5/2004 | Barrett | |
| 6,761,771 B2 | 7/2004 | Satoh | |
| 6,803,513 B2 | 10/2004 | Beernink | |
| 6,841,051 B2 | 1/2005 | Crowley | |
| 7,030,413 B2 | 4/2006 | Nakamura et al. | |
| 7,128,975 B2 * | 10/2006 | Inomata | H01L 21/30604 136/256 |
| 7,164,150 B2 | 1/2007 | Terakawa et al. | |
| 7,328,534 B2 | 2/2008 | Dinwoodie | |
| 7,388,146 B2 | 6/2008 | Fraas | |
| 7,399,385 B2 | 7/2008 | German et al. | |
| 7,534,632 B2 | 5/2009 | Hu et al. | |
| 7,635,810 B2 | 12/2009 | Luch | |
| 7,737,357 B2 | 6/2010 | Cousins | |
| 7,749,883 B2 | 7/2010 | Meeus | |
| 7,769,887 B1 | 8/2010 | Bhattacharyya | |
| 7,772,484 B2 | 8/2010 | Li | |
| 7,777,128 B2 | 8/2010 | Montello | |
| 7,825,329 B2 | 11/2010 | Basol | |
| 7,829,781 B2 | 11/2010 | Montello | |
| 7,829,785 B2 | 11/2010 | Basol | |
| 7,872,192 B1 | 1/2011 | Fraas | |
| 7,905,995 B2 | 3/2011 | German et al. | |
| 7,977,220 B2 | 7/2011 | Sanjurjo | |
| 8,070,925 B2 | 12/2011 | Hoffman et al. | |
| 8,115,093 B2 | 2/2012 | Gui | |
| 8,119,901 B2 | 2/2012 | Jang | |
| 8,152,536 B2 | 4/2012 | Scherer | |
| 8,168,880 B2 | 5/2012 | Jacobs | |
| 8,182,662 B2 | 5/2012 | Crowley | |
| 8,196,360 B2 | 6/2012 | Metten | |
| 8,209,920 B2 | 7/2012 | Krause et al. | |
| 8,222,513 B2 | 7/2012 | Luch | |
| 8,222,516 B2 | 7/2012 | Cousins | |
| 8,258,050 B2 | 9/2012 | Cho | |
| 8,343,795 B2 | 1/2013 | Luo et al. | |
| 8,586,857 B2 | 11/2013 | Everson | |
| 8,671,630 B2 | 3/2014 | Lena | |
| 8,686,283 B2 | 4/2014 | Heng | |
| 8,815,631 B2 | 8/2014 | Cousins | |
| 9,029,181 B2 | 5/2015 | Rhodes | |
| 9,147,788 B2 | 9/2015 | DeGroot | |
| 9,287,431 B2 | 3/2016 | Mascarenhas | |
| 9,761,744 B2 | 9/2017 | Wang | |
| 2001/0008143 A1 | 7/2001 | Sasaoka et al. | |
| 2002/0015881 A1 | 2/2002 | Nakamura | |
| 2002/0072207 A1 | 6/2002 | Andoh | |
| 2002/0086456 A1 | 7/2002 | Cunningham | |
| 2002/0176404 A1 | 11/2002 | Girard | |
| 2002/0189939 A1 | 12/2002 | German | |
| 2003/0000568 A1 | 1/2003 | Gonsiorawski | |
| 2003/0000571 A1 | 1/2003 | Wakuda | |
| 2003/0034062 A1 | 2/2003 | Stern | |
| 2003/0042516 A1 | 3/2003 | Forbes et al. | |
| 2003/0070705 A1 | 4/2003 | Hayden et al. | |
| 2003/0097447 A1 | 5/2003 | Johnston | |
| 2003/0116185 A1 | 6/2003 | Oswald | |

(56) References Cited

U.S. PATENT DOCUMENTS

| | | |
|---|---|---|
| 2003/0118865 A1 | 6/2003 | Marks |
| 2003/0121228 A1 | 7/2003 | Stoehr et al. |
| 2003/0136440 A1 | 7/2003 | Machida |
| 2003/0168578 A1 | 9/2003 | Taguchi et al. |
| 2003/0183270 A1 | 10/2003 | Falk et al. |
| 2003/0201007 A1 | 10/2003 | Fraas |
| 2004/0035458 A1 | 2/2004 | Beernink |
| 2004/0065363 A1 | 4/2004 | Fetzer et al. |
| 2004/0103937 A1 | 6/2004 | Bilyalov et al. |
| 2004/0112419 A1 | 6/2004 | Boulanger |
| 2004/0112426 A1 | 6/2004 | Hagino |
| 2004/0123897 A1 | 7/2004 | Ojima et al. |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira et al. |
| 2005/0022746 A1 | 2/2005 | Lampe |
| 2005/0022861 A1 | 2/2005 | Rose et al. |
| 2005/0061665 A1 | 3/2005 | Pavani |
| 2005/0062041 A1 | 3/2005 | Terakawa |
| 2005/0064247 A1 | 3/2005 | Sane |
| 2005/0074954 A1 | 4/2005 | Yamanaka |
| 2005/0109388 A1 | 5/2005 | Murakami et al. |
| 2005/0126622 A1 | 6/2005 | Mukai |
| 2005/0133084 A1 | 6/2005 | Joge et al. |
| 2005/0178662 A1 | 8/2005 | Wurczinger |
| 2005/0189015 A1 | 9/2005 | Rohatgi et al. |
| 2005/0199279 A1 | 9/2005 | Yoshimine et al. |
| 2005/0252544 A1 | 11/2005 | Rohatgi et al. |
| 2005/0257823 A1 | 11/2005 | Zwanenburg |
| 2005/0268963 A1 | 12/2005 | Jordan |
| 2006/0012000 A1 | 1/2006 | Estes et al. |
| 2006/0060238 A1 | 3/2006 | Hacke et al. |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach et al. |
| 2006/0231803 A1 | 10/2006 | Wang et al. |
| 2006/0255340 A1 | 11/2006 | Manivannan et al. |
| 2006/0260673 A1 | 11/2006 | Takeyama |
| 2006/0272698 A1 | 12/2006 | Durvasula |
| 2006/0283496 A1 | 12/2006 | Okamoto et al. |
| 2006/0283499 A1 | 12/2006 | Terakawa et al. |
| 2007/0023081 A1 | 2/2007 | Johnson et al. |
| 2007/0023082 A1 | 2/2007 | Manivannan et al. |
| 2007/0108437 A1 | 5/2007 | Tavkhelidze |
| 2007/0110975 A1 | 5/2007 | Schneweis |
| 2007/0132034 A1 | 6/2007 | Curello et al. |
| 2007/0137699 A1 | 6/2007 | Manivannan et al. |
| 2007/0148336 A1 | 6/2007 | Bachrach et al. |
| 2007/0186853 A1 | 8/2007 | Gurary |
| 2007/0186968 A1 | 8/2007 | Nakauchi |
| 2007/0186970 A1 | 8/2007 | Takahashi et al. |
| 2007/0187652 A1 | 8/2007 | Konno |
| 2007/0202029 A1 | 8/2007 | Burns et al. |
| 2007/0235077 A1 | 10/2007 | Nagata |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann et al. |
| 2007/0283997 A1 | 12/2007 | Hachtmann |
| 2008/0000522 A1 | 1/2008 | Johnson |
| 2008/0011350 A1 | 1/2008 | Luch |
| 2008/0035489 A1 | 2/2008 | Allardyce |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar et al. |
| 2008/0053519 A1 | 3/2008 | Pearce |
| 2008/0061293 A1 | 3/2008 | Ribeyron |
| 2008/0092947 A1 | 4/2008 | Lopatin et al. |
| 2008/0121272 A1 | 5/2008 | Besser et al. |
| 2008/0121276 A1 | 5/2008 | Lopatin et al. |
| 2008/0121932 A1 | 5/2008 | Ranade |
| 2008/0128013 A1 | 6/2008 | Lopatin |
| 2008/0128017 A1 | 6/2008 | Ford |
| 2008/0149161 A1 | 6/2008 | Nishida et al. |
| 2008/0149163 A1 | 6/2008 | Gangemi |
| 2008/0156370 A1 | 7/2008 | Abdallah et al. |
| 2008/0173347 A1 | 7/2008 | Korevaar |
| 2008/0173350 A1 | 7/2008 | Choi et al. |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness et al. |
| 2008/0223439 A1 | 9/2008 | Deng |
| 2008/0230122 A1 | 9/2008 | Terakawa |
| 2008/0251114 A1 | 10/2008 | Tanaka |
| 2008/0251117 A1 | 10/2008 | Schubert et al. |
| 2008/0264477 A1 | 10/2008 | Moslehi |
| 2008/0276983 A1 | 11/2008 | Drake et al. |
| 2008/0283115 A1 | 11/2008 | Fukawa et al. |
| 2008/0302030 A1 | 12/2008 | Stancel et al. |
| 2008/0303503 A1 | 12/2008 | Wolfs |
| 2008/0308145 A1 | 12/2008 | Krasnov et al. |
| 2009/0007965 A1 | 1/2009 | Rohatgi et al. |
| 2009/0014055 A1 | 1/2009 | Beck |
| 2009/0056805 A1 | 3/2009 | Barnett |
| 2009/0065043 A1 | 3/2009 | Hadorn |
| 2009/0078318 A1 | 3/2009 | Meyers et al. |
| 2009/0084439 A1 | 4/2009 | Lu et al. |
| 2009/0101872 A1 | 4/2009 | Young et al. |
| 2009/0120492 A1 | 5/2009 | Sinha |
| 2009/0139512 A1 | 6/2009 | Lima |
| 2009/0151771 A1 | 6/2009 | Kothari |
| 2009/0151783 A1 | 6/2009 | Lu et al. |
| 2009/0155028 A1 | 6/2009 | Boguslayskiy |
| 2009/0160259 A1 | 6/2009 | Ravindranath |
| 2009/0188561 A1 | 7/2009 | Aiken et al. |
| 2009/0194233 A1 | 8/2009 | Tamura |
| 2009/0221111 A1 | 9/2009 | Frolov et al. |
| 2009/0229854 A1 | 9/2009 | Fredenberg |
| 2009/0239331 A1 | 9/2009 | Xu et al. |
| 2009/0250108 A1 | 10/2009 | Zhou et al. |
| 2009/0255574 A1 | 10/2009 | Yu et al. |
| 2009/0272419 A1 | 11/2009 | Sakamoto |
| 2009/0283138 A1 | 11/2009 | Lin et al. |
| 2009/0283145 A1 | 11/2009 | Kim et al. |
| 2009/0293948 A1 | 12/2009 | Tucci et al. |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman et al. |
| 2010/0043863 A1 | 2/2010 | Wudu |
| 2010/0065111 A1 | 3/2010 | Fu et al. |
| 2010/0068890 A1 | 3/2010 | Stockum et al. |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu et al. |
| 2010/0131108 A1 | 5/2010 | Meyer |
| 2010/0132774 A1 | 6/2010 | Borden |
| 2010/0132792 A1 | 6/2010 | Kim et al. |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch et al. |
| 2010/0229914 A1 | 9/2010 | Adriani |
| 2010/0236612 A1 | 9/2010 | Khajehoddin |
| 2010/0240172 A1 | 9/2010 | Rana |
| 2010/0243021 A1 | 9/2010 | Lee |
| 2010/0269904 A1 | 10/2010 | Cousins |
| 2010/0279492 A1 | 11/2010 | Yang |
| 2010/0300506 A1 | 12/2010 | Yu |
| 2010/0300507 A1 | 12/2010 | Heng |

(56) References Cited

U.S. PATENT DOCUMENTS

| | | |
|---|---|---|
| 2010/0300525 A1 | 12/2010 | Lim |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0023958 A1 | 2/2011 | Masson |
| 2011/0030777 A1 | 2/2011 | Lim |
| 2011/0048491 A1 | 3/2011 | Taira |
| 2011/0073175 A1 | 3/2011 | Hilali |
| 2011/0088762 A1 | 4/2011 | Singh |
| 2011/0120518 A1 | 5/2011 | Rust |
| 2011/0146759 A1 | 6/2011 | Lee |
| 2011/0146781 A1 | 6/2011 | Laudisio et al. |
| 2011/0156188 A1 | 6/2011 | Tu |
| 2011/0168250 A1 | 7/2011 | Lin et al. |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng et al. |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch et al. |
| 2011/0308573 A1 | 12/2011 | Jaus |
| 2012/0000502 A1 | 1/2012 | Wiedeman |
| 2012/0012153 A1 | 1/2012 | Azechi |
| 2012/0012174 A1 | 1/2012 | Wu |
| 2012/0028461 A1 | 2/2012 | Ritchie et al. |
| 2012/0031480 A1 | 2/2012 | Tisler |
| 2012/0040487 A1 | 2/2012 | Asthana |
| 2012/0042925 A1 | 2/2012 | Pfennig |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Heng |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu |
| 2012/0199184 A1 | 8/2012 | Nie |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng et al. |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0019919 A1 | 1/2013 | Hoang |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | Degroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2013/0306128 A1 | 11/2013 | Kannou |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0120699 A1 | 5/2014 | Hua |
| 2014/0124013 A1 | 5/2014 | Morad et al. |
| 2014/0124014 A1 | 5/2014 | Morad et al. |
| 2014/0154836 A1 | 6/2014 | Kim |
| 2014/0196768 A1 | 7/2014 | Heng et al. |
| 2014/0242746 A1 | 8/2014 | Albadri |
| 2014/0261624 A1 | 9/2014 | Cruz-Campa |
| 2014/0299187 A1 | 10/2014 | Chang |
| 2014/0318611 A1 | 10/2014 | Moslehi |
| 2014/0345674 A1 | 11/2014 | Yang et al. |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0144180 A1 | 5/2015 | Baccini |
| 2015/0171230 A1 | 6/2015 | Kapur |
| 2015/0214409 A1 | 7/2015 | Pfeiffer |
| 2015/0236177 A1 | 8/2015 | Fu |
| 2015/0270410 A1 | 9/2015 | Heng |
| 2015/0280641 A1 | 10/2015 | Garg |
| 2015/0340531 A1 | 11/2015 | Hayashi |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0163888 A1 | 6/2016 | Reddy |
| 2016/0190354 A1 | 6/2016 | Agrawal |
| 2016/0204289 A1 | 7/2016 | Tao |
| 2016/0322513 A1 | 11/2016 | Martin |
| 2016/0329443 A1 | 11/2016 | Wang |
| 2017/0084766 A1 | 3/2017 | Yang |
| 2017/0222082 A1 | 8/2017 | Lin |

FOREIGN PATENT DOCUMENTS

| | | |
|---|---|---|
| CN | 101233620 | 7/2008 |
| CN | 101553933 | 10/2009 |
| CN | 102012010151 | 1/2010 |
| CN | 101305454 | 5/2010 |
| CN | 102088040 | 6/2011 |
| CN | 102263157 | 11/2011 |
| CN | 104205347 | 12/2014 |
| CN | 2626907 A1 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | H04245683 A | 11/2013 |
| EP | 1770791 | 4/2007 |
| EP | 1816684 | 8/2007 |
| EP | 2071635 | 6/2009 |
| EP | 2113946 | 11/2009 |

(56) References Cited

FOREIGN PATENT DOCUMENTS

| | | |
|---|---|---|
| EP | 2362430 | 8/2011 |
| EP | 2385561 | 11/2011 |
| EP | 2387079 | 11/2011 |
| EP | 2002057357 A | 11/2011 |
| EP | 2011123646 A2 | 7/2012 |
| EP | 2479796 A1 | 8/2013 |
| EP | 2479796 | 7/2015 |
| EP | 2626907 | 8/2015 |
| JP | 5789269 | 6/1982 |
| JP | S7089269 | 6/1982 |
| JP | 2011008881 A2 | 9/1992 |
| JP | 06196766 | 7/1994 |
| JP | 2385561 A2 | 9/1995 |
| JP | 10004204 | 1/1998 |
| JP | H1131834 | 2/1999 |
| JP | 2000164902 | 6/2000 |
| JP | 2010085949 | 2/2002 |
| JP | 20050122721 A | 6/2005 |
| JP | 2006523025 | 10/2006 |
| JP | 2006324504 | 11/2006 |
| JP | 2007123792 | 5/2007 |
| JP | 2008135655 | 6/2008 |
| JP | 2009054748 | 3/2009 |
| JP | 2009177225 | 8/2009 |
| JP | 2011181966 | 9/2011 |
| JP | 2012119393 | 6/2012 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 2003083953 A1 | 12/2005 |
| KR | 2005159312 A | 1/2006 |
| KR | 2006097189 A1 | 2/2009 |
| WO | 9120097 A1 | 11/1991 |
| WO | 2011005447 A2 | 12/1991 |
| WO | 1991017839 | 10/2003 |
| WO | 20060003277 A | 9/2006 |
| WO | 2008089657 | 7/2008 |
| WO | 2009094578 | 7/2009 |
| WO | 2009150654 | 12/2009 |
| WO | 20090011519 A | 12/2009 |
| WO | 2010070015 | 6/2010 |
| WO | 2009150654 A2 | 7/2010 |
| WO | 2010075606 | 7/2010 |
| WO | H07249788 A | 8/2010 |
| WO | 2010075606 A1 | 9/2010 |
| WO | 100580957 C | 10/2010 |
| WO | 2010123974 | 10/2010 |
| WO | 2010104726 A2 | 1/2011 |
| WO | 2010123974 A1 | 1/2011 |
| WO | 2011005447 | 1/2011 |
| WO | 2011008881 | 1/2011 |
| WO | 2011053006 | 5/2011 |
| WO | 104409402 | 10/2011 |
| WO | 2013020590 | 2/2013 |
| WO | 2013020590 A1 | 2/2013 |
| WO | 2013046351 | 4/2013 |
| WO | 2014066265 | 5/2014 |
| WO | 2014074826 | 5/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

Machine translation of JP 10004204 A, Shindou et al.
Hornbachner et a ., "Cambered Photovoltaic Module and Method for its Manufacture" Jun. 17, 2009.
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1-5, 2008, pp. 1149-1152.
L. Korte et al. "Overview on a-Se:H/c heterojunction solar cells—physics and technology", Proceedings of the 22nd European Photovoltaic Solar Energy Conference, Sep. 3-7, 2007, pp. 859-865.
Jianhua Zhao et al. "24% Efficient pert silicon solar cell: Recent improvements in high efficiency silicon cell research".
Chabal, Yves J. et al., 'Silicon Surface and Interface Issues for Nanoelectronics,' The Electrochemical Society Interface, Spring 2005, pp. 31-33.
Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%201.pptx> and converted to PDF.
Davies, P.C.W., 'Quantum tunneling time,' Am. J. Phys. 73, Jan. 2005, pp. 23-27.
Green, Martin A. et al., 'High-Efficiency Silicon Solar Cells,' IEEE Transactions on Electron Devices, vol. ED-31, No. 5, May 1984, pp. 679-683.
Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.
Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.
WP Leroy et al., "In Search for the Limits of Rotating Cylindrical Magnetron Sputtering", Magnetron, ION Processing and ARC Technologies European Conference, Jun. 18, 2010, pp. 1-32.
Beaucarne G et al: 'Epitaxial thin-film Si solar cells' Thin Solid Films, Elsevier-Sequoia S.A. Lausanne, CH LNKD-DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].
Collins English Dictionary (Convex. (2000). In Collins English Dictionary. http://search.credoreference.com/content/entry/hcengdict/convex/0 on Oct. 18, 2014).
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.
JCS Pires, J Otubo, AFB Braga, PR Mei; The purification of metallurgical grade silicon by electron beam melting, J of Mats Process Tech 169 (2005) 16-20.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary—"mesh". (accessed Oct. 8, 2012).
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Mueller, Thomas, et al. "High quality passivation for heteroj unction solar cells by hydrogenated amorphous silicon suboxide films." Applied Physics Letters 92.3 (2008): 033504-033504.

(56) References Cited

OTHER PUBLICATIONS

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

Electrically Conductive Foil Tape for Bus Bar Components in Photovoltaic Modules, Adhesives Research, http://www.adhesivesresearch.com/electrically-conductive-foil-tape-for-bus-bar-components-in-photovoltaic-modules/, accessed Oct. 12, 2017.

Geissbuhler et al., Silicon Heterojunction solar Cells with Copper-Plated Grid Electrodes: Status and Comparison with Silver Thick-Film Techniques, IEEE Journal of Photovoltaics, vol. 4, No. 4, Jul. 2014.

Meyerson et al. "Nonequilibrium boron doping effects in low-temperature epitaxial silicon", Appl. Phys. Lett. 50 (2), p. 113 (1987).

Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.

\* cited by examiner

ALUMINUM GRID AS BACKSIDE CONDUCTOR ON EPITAXIAL SILICON THIN FILM SOLAR CELLS

RELATED APPLICATION

The present patent is a continuation of, and hereby claims priority to, pending U.S. patent application Ser. No. 12/617,382, entitled "ALUMINUM GRID AS BACKSIDE CONDUCTOR ON EPITAXIAL SILICON THIN FILM SOLAR CELLS," by inventors Chentao Yu, Zheng Xu, Jiunn Benjamin Heng, and Jianming Fu, filed on Nov. 12, 2009.

BACKGROUND

Field

This disclosure is generally related to a solar cell. More specifically, this disclosure is related to a solar cell that uses an aluminum grid as a backside conductor.

Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal bandgaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a solar cell, light is absorbed near the p-n junction, generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

Figure 1:
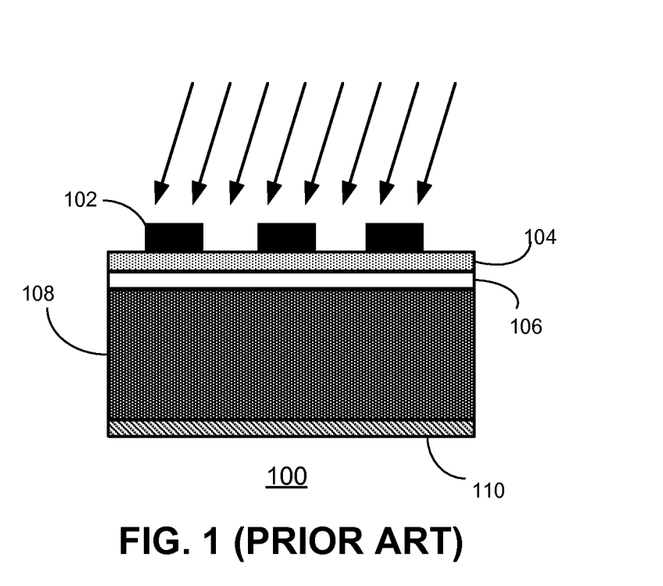
FIG. 1 presents a diagram illustrating an exemplary homojunction solar cell based on a crystalline-Si substrate (prior art).

FIG. 1 presents a diagram illustrating an exemplary homojunction solar cell based on a crystalline-Si (c-Si) substrate (prior art). Solar cell 100 includes a front side electrode grid 102, an anti-reflective SiN layer 104, an n$^+$ c-Si emitter layer 106, a p-type c-Si substrate 108, and an aluminum (Al) backside electrode 110. Arrows in FIG. 1 indicate incident sunlight. Note that when forming Al backside electrode 110, standard operations include screen-printing and firing of Al paste. Al forms a eutectic alloy with Si at a temperature of 577° C. During the firing process, a liquid Al—Si phase is formed according to the Al—Si phase diagram. The molten Al—Si region acts as a sink for many impurities, giving a perfect gettering effect. The p$^+$ region generated by the firing of Al forms a back surface field (BSF), which introduce a barrier to minority carrier flow to the back surface of the solar cell. Note that the whole backside of the solar cell needs to be covered by the Al paste to ensure sufficient passivation.

Based on industrial surveys, crystalline-Si-wafer based solar cells dominate nearly 90% of the market. However, the cost of conventional solar grade Si is well above $100/kg, which drives the cost of solar cells to $3-$4 per Watt peak (Wp). In addition to the cost of solar grade Si wafers, the cost of Al used for the backside electrode can also be significant, given that a large amount of Al is needed to cover the whole backside of the solar cell.

SUMMARY

One embodiment of the present invention provides a solar cell. The solar cell includes a substrate, a first heavily doped crystalline-Si (c-Si) layer situated above the substrate, a lightly doped c-Si layer situated above the first heavily doped crystalline-Si layer, a second heavily doped c-Si layer situated above the lightly doped c-Si layer, a front side electrode grid situated above the second heavily doped c-Si layer, and a backside electrode grid situated on the backside of the substrate.

In a variation on the embodiment, the substrate is an MG-Si substrate.

In variation on the embodiment, the backside electrode grid comprises Al paste.

In a further variation, the Al paste includes Al and one or more of the following materials: frit, Ag, Pd, Cr, Zn, and Sn.

In a variation on the embodiment, the backside electrode grid is formed using screen-printing or aerosol-jet printing.

In a further variation, the backside electrode grid is solderable, and the backside electrode grid is formed using a single printing step.

In a variation on the embodiment, the backside electrode grid pattern includes one or more of: straight lines, crossed lines, zigzagged lines, and circles.

In a variation on the embodiment, the first heavily doped c-Si layer and the lightly doped c-Si layer are p-type doped, and the second heavily doped c-Si layer is n-type doped.

In a variation on the embodiment, the first heavily doped c-Si layer and the lightly doped c-Si layer are deposited using a chemical-vapor-deposition (CVD) technique.

In a variation on the embodiment, the solar cell further includes a dielectric layer stack situated above the second heavily doped c-Si layer.

In a further variation, the dielectric layer stack includes at least one of: SiO2, SiNx:H, and SiOxNy.

BRIEF DESCRIPTION OF THE FIGURES

FIG. 2 presents a diagram illustrating the process of fabricating a solar cell in accordance with an embodiment of the present invention. 2A illustrates a Si substrate. 2B illustrates a heavily doped crystalline Si (c-Si) layer grown on top of the Si substrate. 2C illustrates a lightly doped c-Si base film grown on the heavily doped c-Si layer. 2D illustrates the surface texture of the c-Si base film. 2E illustrates an emitter layer formed on the c-Si base film. 2F illustrates a layer of SiO$_2$ formed on the emitter layer. 2G illustrates a layer of SiN$_x$:H formed on the SiO$_2$ layer. 2H illustrates the front-side metal grid formed on the SiN$_x$:H layer. 2I illustrates the top view of the front-side metal grid. 2J illustrates forming finger strips of a back-side metal grid. 2K illustrates the bottom view of the solar cell showing the finger strips.

2L illustrates forming the back-side busbars. 2M illustrates the front-side and the back-side electrode grids.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a solar cell that uses an Al grid as a backside electrode. A thin layer of heavily p-type doped c-Si is deposited on a metallurgical-grade Si (MG-Si) substrate forming a back-surface-field (BSF) layer, and a thin layer of lightly p-type doped c-Si is deposited on the BSF layer to form a base layer. The emitter layer can be formed by depositing a heavily n-type doped c-Si layer or by diffusing n-type dopants, such as phosphorous, at a high temperature. A dielectric layer stack that includes one or more of silicon oxy-nitride ($SiO_xN_y$), silicon-dioxide ($SiO_2$), and hydrogen-rich silicon-nitride ($SiN_x$:H) is used for passivation and anti-reflection. Instead of applying a layer of Al paste to cover the whole backside of the solar cell, the backside electrode is formed by screen-printing or aerosol-jet printing of an Al grid, thus reducing the fabrication cost.

Fabrication Process

FIG. 2 presents a diagram illustrating the process of fabricating a solar cell in accordance with an embodiment of the present invention.

Figure 2A:
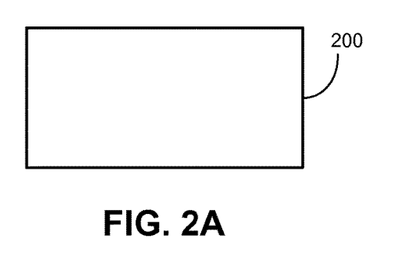

In operation 2A, an MG-Si substrate 200 is prepared. Because MG-Si is much cheaper than c-Si, solar cells based on MG-Si substrates have a significantly lower manufacture cost. The purity of MG-Si is usually between 98% and 99.99%. To ensure a high efficiency of the subsequently fabricated solar cell, the starting MG-Si substrate ideally has a purity of 99.9% or better. In addition, the surface of the MG-Si substrate needs to be further purified. In one embodiment, MG-Si substrate 200 is baked at a temperature between 1100° C. and 1250° C. in a chemical-vapor-deposition (CVD) chamber filled with hydrogen ($H_2$) in order to remove native silicon-oxide in the substrate. Afterwards, at the same temperature, hydrogen chloride (HCl) gas is introduced inside the CVD chamber to leach out any residual metal impurities from MG-Si substrate 200, thus further preventing the impurities from diffusing into the subsequently grown c-Si thin films. Due to the fact that metal impurities, such as iron, have a high diffusion coefficient at this temperature, the metal impurities tend to migrate to the surface of substrate 200, and react with the HCl gas to form volatile chloride compounds. The volatile chloride compounds can be effectively purged from the chamber using a purge gas, such as $H_2$. Note that the metal-impurity leaching process can be carried out either in the CVD chamber, which is subsequently used for the growth of c-Si thin films, or in another stand-alone furnace. The metal-impurity leaching process can take between 1 minute and 120 minutes. MG-Si substrate 200 can be either p-type doped or n-type doped. In one embodiment, MG-Si substrate 200 is p-type doped.

Figure 2B:
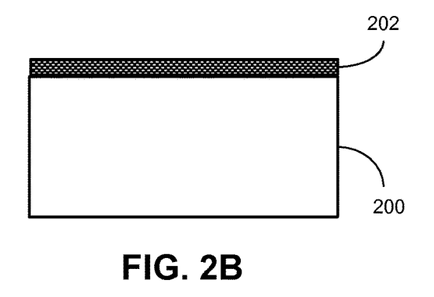

In operation 2B, a thin layer of heavily doped (with a doping concentration of greater than $1\times10^{17}/cm^3$) c-Si film 202 is epitaxially grown on the surface of MG-Si substrate 200. Various methods can be used to epitaxially grow c-Si thin film 202 on MG-Si substrate 200. In one embodiment, c-Si thin film 202 is grown using a CVD process, such as plasma-enhanced CVD (PECVD). Various types of Si compounds, such as $SiH_4$, $SiH_2Cl_2$, and $SiHCl_3$, can be used in the CVD process to form c-Si thin film 202. In one embodiment, $SiHCl_3$ (TCS) is used due to its abundance and low cost. C-Si thin film 202 can be either p-type doped or n-type doped. In one embodiment, boron is added to make thin film 202 p-type doped. The doping concentration of thin film 202 can be between $1\times10^{17}/cm^3$ and $1\times10^{20}/cm^3$, and the thickness of thin film 202 can be between 1 μm and 8 μm. Because c-Si thin film 202 is heavily doped, it can act as a back-surface field (BSF) and barrier for minority carriers, hence reducing minority carrier recombination at the back surface of the subsequently grown base film. The existence of BSF layer 202 makes an Al-BSF layer unnecessary. Hence, instead of covering the whole backside of the solar cell with Al paste, it is possible to partially cover the backside with Al paste because the metal only serves as an electrical contact.

Figure 2C:
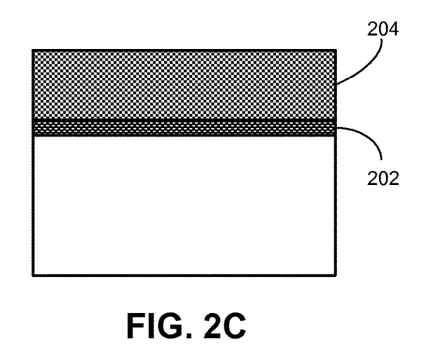

In operation 2C, a layer of lightly doped (with a doping concentration of less than $5\times10^{17}/cm^3$) c-Si base film 204 is epitaxially grown on top of thin film 202. The growing process of base film 204 can be similar to that used for thin film 202. Similarly, base film 204 can be either p-type doped or n-type doped. In one embodiment, base film 204 is lightly doped with a p-type dopant, such as boron. The doping concentration of base film 204 can be between $5\times10^{15}/cm^3$ and $5\times10^{17}/cm^3$, and the thickness of base film 204 can be between 5 μm and 100 μm. Note that, compared with a conventional bulk solar cell that uses a c-Si wafer as a base layer, embodiments of the present invention use an epitaxially grown crystalline-Si film as a base layer, which can be much thinner than a c-Si wafer. As a result, the manufacture cost of solar cells can be significantly reduced.

Figure 2D:
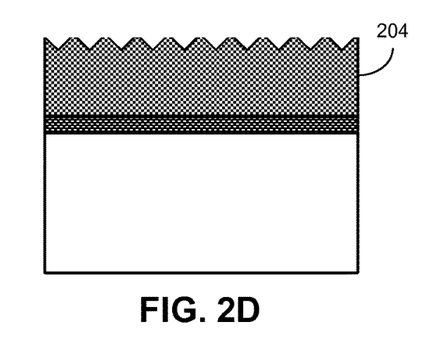

In operation 2D, the surface of base film 204 can be textured to maximize light absorption inside the solar cell, thus further enhancing efficiency. The surface texturing can be performed using various etching techniques including dry plasma etching and wet chemical etching. The etchants used in the dry plasma etching include, but are not limited to: $SF_6$, $F_2$, and $NF_3$. The wet chemical etchant can be an alkaline solution. The shapes of the surface texture can be pyramids or inverted pyramids, which are randomly or regularly distributed on the surface of base film 204.

Figure 2E:
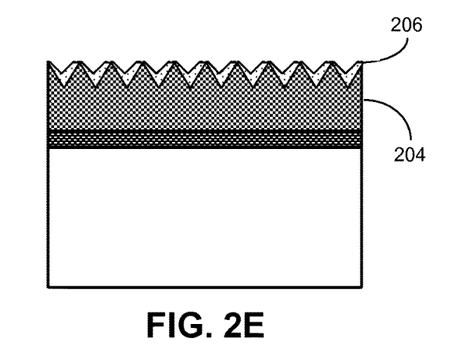

In operation 2E, a thin layer of heavily doped c-Si film is formed on base film 204 to form an emitter layer 206. Depending on the doping type of base film 204, emitter layer 206 can be either n-type doped or p-type doped. In one embodiment, emitter layer 206 is heavily doped with an n-type dopant, such as phosphorus. The doping concentration of emitter layer 206 can be between $5\times10^{17}/cm^3$ and $5\times10^{20}/cm^3$. In one embodiment, emitter layer 206 can be formed by diffusing ions in a diffusion chamber or by in-situ doping in the CVD chamber where base film 204 is formed. In a further embodiment, emitter layer 206 can be formed using a CVD process, such as PECVD.

Figure 2F:
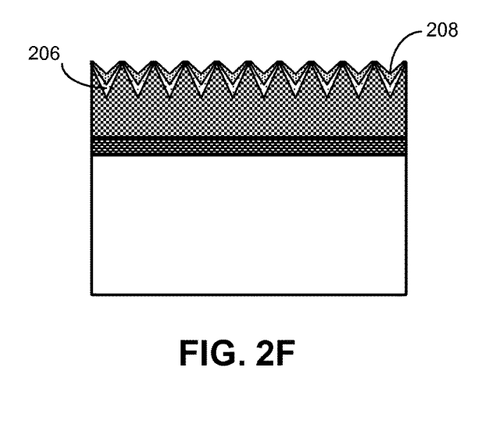

In operation 2F, a thin layer of $SiO_2$ (layer 208) is formed on top of emitter layer 206. $SiO_2$ layer 208 can be formed using different oxidation techniques including dry oxidation, rapid thermal oxidation (RTO), and wet oxidation. For example, SiO$_2$ layer 208 can be formed by flowing oxygen (O$_2$) over the surface of emitter layer 206 at a high temperature between 700° C. and 1050° C. The thickness of SiO$_2$ layer 208 can be between 10 Å and 300 Å, preferably between 100 Å and 200 Å. SiO$_2$ layer 208 can further reduce minority-carrier surface recombination, because the oxide growth can effectively remove Si surface interstitial defects, thus passivating the dangling bonds.

Figure 2G:
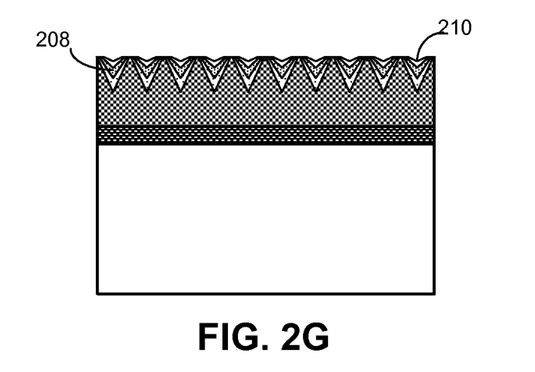

In operation 2G, a relatively thick layer of SiN$_x$:H (layer 210) is deposited on top of SiO$_2$ layer 208. Techniques used for depositing SiN$_x$:H layer 210 include, but are not limited to: PECVD, sputtering, and electron beam (e-beam) evaporation. In addition to passivation by hydrogenation and surface field effect, SiN$_x$:H layer 210 also acts as an anti-reflective layer. In order to reduce light reflection effectively, SiN$_x$:H layer 210 has a thickness between 500 Å and 1000 Å. In addition to SiN$_x$:H, other materials, such as ZnS and TiO$_2$ can also be used to form an anti-reflective layer.

Figure 2H:
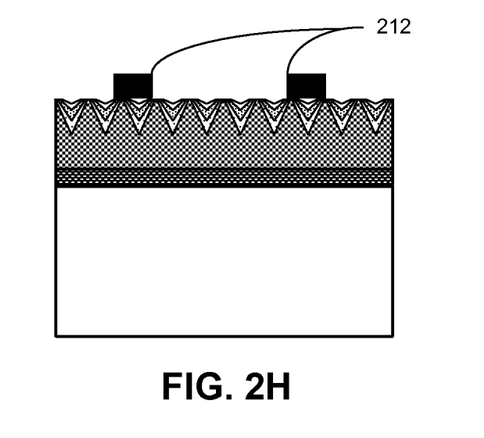
Figure 2I:
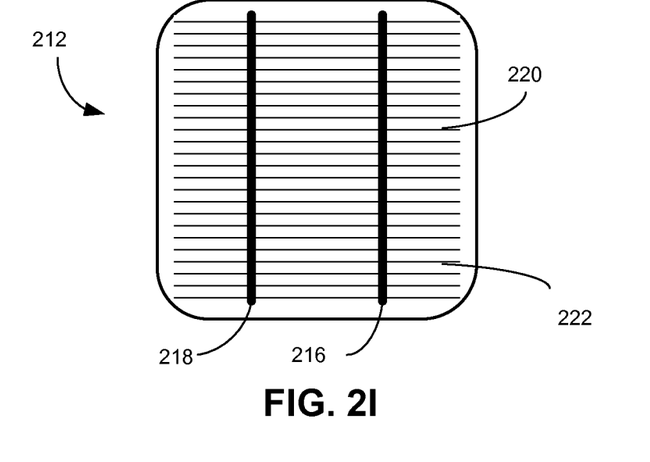

In operation 2H, a frontside metal grid 212 is formed by screen printing Ag paste on top of SiN$_x$:H layer 210. During the screen printing process, Ag paste is forced through a patterned screen to form a metal pattern on the front surface of the solar cell. In a further embodiment, front side metal grid 212 is formed by aerosol-jet printing Ag ink with glass frit. FIG. 2I illustrates the top view of front side electrode grid 212. Front side electrode grid 212 includes busbars, such as busbars 216 and 218, and fingers, such as fingers 220 and 222. Busbars are thicker metal strips connected directly to the external leads, and fingers are finer metal strips that collect current for delivery to the busbars.

Figure 2J:
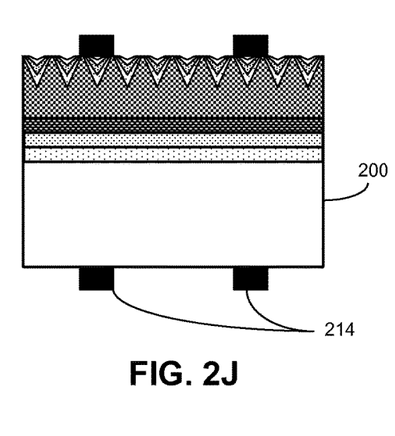
Figure 2K:
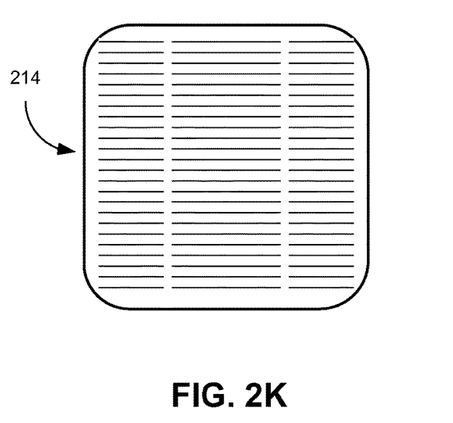

In operation 2J, finger strips of a backside metal grid 214 are formed by screen-printing or aerosol-jet printing Al paste on the backside of MG-Si substrate 200. FIG. 2K illustrates the bottom view of the solar cell. Note that the Al finger strips do not run all the way across the backside of the solar cell, leaving empty spaces for forming solderable busbars. Also note that, in addition to straight lines, Al finger strips can also take other geometric forms, including, but not limited to: crossed lines, zigzagged lines, and circles. In some embodiments, Al finger strips form irregular patterns. There is a trade-off between the sheet resistivity of the Al finger strip and the cost of Al. In one embodiment, Al finger strips covers roughly 10% of the back surface of the solar cell. Compared with a solar cell with its whole backside covered by Al, the cost to fabricate the solar cell with the patterned backside Al electrode is reduced because only 10% Al is needed.

Figure 2L:
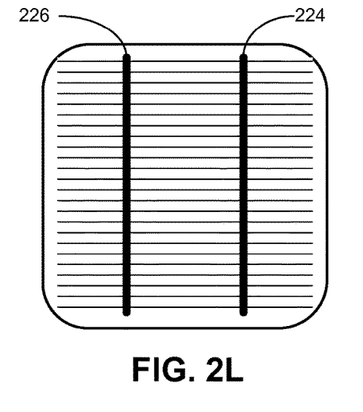

In operation 2L, solderable busbars are formed on the backside of MG-Si substrate 200. Solderable busbars 224 and 226 connect to external leads and collect current from the Al finger strips. In one embodiment, busbars 224 and 226 are formed by screen-printing or aerosol-jet printing Ag paste.

In some embodiments, operation 2J and operation 2L can be combined into a single operation that prints both the fingers and the busbars. Because Al alone does not provide solderability, in some embodiments, the printing material that is used to form finger strips and busbars in a single operation includes Al paste (a mixture of Al, glass frit, and solvent) mixed with one or more of other metals including, but not limited to: Ag, Pd, Cr, Zn, and Sn.

Figure 2M:
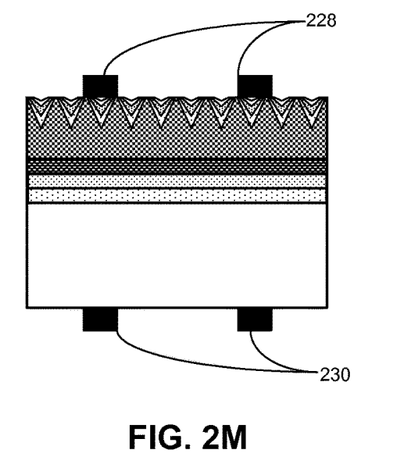

In operation 2M, front side metal grid 212 and backside metal grid 214 are co-fired at a temperature above 500° C. to form front side and backside ohmic contact. Hence, front side metal grid 212 becomes front side electrode grid 228 and backside metal grid 214 becomes backside electrode grid 230. Traditionally, in order to form a good ohmic contact between front side electrode grid 228 and emitter layer 206, photolithography is needed to open a window in SiO$_2$ layer 208 and SiN$_x$:H layer 210. Such a lithographic process is expensive and is not suitable for low-cost, large-scale solar cell manufacture. However, when firing at a high temperature, Ag paste can etch through SiO$_2$ layer 208 and SiN$_x$:H layer 210 to make a good ohmic contact with emitter layer 206.

The use of an MG-Si substrate and a patterned backside electrode greatly reduces the fabrication cost, making it possible to fabricate solar cells at a price that is below $1/Wp. The inclusion of a heavily doped c-Si layer acting as BSF ensures the high efficiency (>17%) of the fabricated solar cell.

In addition to saving fabrication costs, using a patterned backside electrode also solves the wafer-warping problem, which is often caused by the thick layer of Al paste on the backside of a wafer, making using a thinner (<50 μm) substrate possible.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar cell, comprising:
   a metallurgical-grade silicon substrate;
   a first doped crystalline-silicon layer that is epitaxially formed on the metallurgical-grade silicon substrate;
   a lightly doped crystalline-silicon base layer epitaxially formed on the first doped crystalline-silicon layer, wherein a doping concentration of the first doped crystalline-silicon layer is greater than that of the lightly doped crystalline-silicon base layer;
   a second doped crystalline-silicon layer which is formed on the lightly doped crystalline-silicon base layer and has a doping concentration greater than that of the lightly doped crystalline-silicon base layer;
   a first metal electrode grid; and
   a second metal electrode grid;
   wherein the lightly doped crystalline-silicon base layer, first doped crystalline-silicon layer, second doped crystalline-silicon layer, and second electrode grid are positioned on a first side of the metallurgical-grade silicon substrate;
   wherein the lightly doped crystalline-silicon base layer is between the first doped crystalline-silicon layer and second doped crystalline-silicon layer;
   wherein the second metal electrode grid is electrically coupled to the second doped crystalline-silicon layer; and
   wherein the first metal electrode grid is positioned on a second side of the metallurgical-grade silicon substrate.

2. The solar cell of claim 1, wherein the second metal electrode grid comprises a number of finger strips and at least one busbar.

3. The solar cell of claim 1, further comprising a dielectric passivation layer between the second doped crystalline-silicon layer and the second metal electrode grid, wherein the dielectric passivation layer is in direct contact with the second doped crystalline-silicon layer.

4. The solar cell of claim 1, wherein the first doped crystalline-silicon layer is in direct contact with the metallurgical-grade silicon substrate.

5. The solar cell of claim 1, wherein the first and second doped crystalline-silicon layers are in direct contact with the lightly doped crystalline-silicon base layer.

6. The solar cell of claim 1, wherein the lightly doped crystalline-silicon base layer is n-type doped.

7. The solar cell of claim 1, wherein the first doped crystalline-silicon layer is p-type doped.

8. The solar cell of claim 1, wherein the second doped crystalline-silicon layer is n-type doped.

9. The solar cell of claim 1, wherein the first and second metal electrode grids comprise Al.

10. The solar cell of claim 9, wherein the first and second metal electrode grids further comprise one or more of the following materials:
   frit;
   Ag;
   Pd;
   Cr;
   Zn; and
   Sn.

11. The solar cell of claim 1, further comprising an anti-reflection layer between the second doped crystalline-silicon layer and the second metal electrode grid.

* * * * *